United States Patent
Chen et al.

(10) Patent No.: US 6,808,980 B2
(45) Date of Patent: Oct. 26, 2004

(54) METHOD OF PROCESS SIMPLIFICATION AND ELIMINATING TOPOGRAPHY CONCERNS FOR THE CREATION OF ADVANCED 1T-RAM DEVICES

(75) Inventors: Chung-Yi Chen, Hsinchu (TW); Min-Hsiung Chiang, Taipei (TW); Hsien-Yuan Chang, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/310,486

(22) Filed: Dec. 5, 2002

(65) Prior Publication Data

US 2004/0108533 A1 Jun. 10, 2004

(51) Int. Cl.[7] .......................................... H01L 21/8242
(52) U.S. Cl. ........................ 438/243; 438/386; 438/242
(58) Field of Search ................................. 438/241–253, 438/396–398; 257/295–310

(56) References Cited

U.S. PATENT DOCUMENTS

| | | | | |
|---|---|---|---|---|
| 5,172,202 A | | 12/1992 | Kazuo | 257/306 |
| 6,177,697 B1 | * | 1/2001 | Cunningham | 257/301 |
| 6,258,660 B1 | * | 7/2001 | Walker et al. | 438/244 |
| 6,284,584 B1 | | 9/2001 | Hodges et al. | 438/238 |

FOREIGN PATENT DOCUMENTS

| | | | | |
|---|---|---|---|---|
| TW | | 483157 | 4/2002 | H01L/27/108 |

* cited by examiner

Primary Examiner—Cuong Nguyen

(57) ABSTRACT

A new method and structure is provided for the creation of a 1T-RAM cell. Shallow Trench Isolation (STI) regions are provided over a substrate. A 3D capacitor area is defined over the substrate, a patterned layer of polysilicon or HSG polysilicon is created aligned with the 3D capacitor area, providing the bottom plate of a 3D capacitor. Gate oxide is grown to form a dielectric for CMOS gate electrodes and the 3D capacitor dielectric. A patterned layer of polysilicon is created, defining gate electrodes and 3D capacitor upper plates.

44 Claims, 4 Drawing Sheets

… (US 6,808,980 B2)

METHOD OF PROCESS SIMPLIFICATION AND ELIMINATING TOPOGRAPHY CONCERNS FOR THE CREATION OF ADVANCED 1T-RAM DEVICES

RELATED PATENT APPLICATION

This application is related to Ser. No. 10/400,401 filed Mar. 27, 2003, assigned to a common assignee.

BACKGROUND OF THE INVENTION

(1) Field of the Invention

The invention relates to the fabrication of integrated circuit devices, and more particularly, to a method and structure for the creation of a 1T-RAM device that provides for process simplification, removes concerns of surface planarity and that allows for aggressive shrinkage of the cell size due to the manner in which a larger 1T-RAM cell capacitor is created.

(2) Description of the Prior Art

An important aspect of the creation of Dynamic Random Access Memory (DRAM) devices is the creation of the capacitive storage capability, whereby it is essential that storage node capacitor cell plates be large enough to retain an adequate voltage level without thereby being detrimentally affected by parasitic components of the structure or device noise that may be present during the operation of the device. Device performance improvements continue to be gained by reducing device dimensions, increasing the device density.

Typical DRAM storage cells are created comprising one single Metal-Oxide-Semiconductor Field-Effect-Transistor (MOS-FET) and a single capacitor, this DRAM storage cell is commonly referred to as a 1T-RAM device. The 1T-RAM device stores one bit of data on the capacitor as an electrical charge. Reductions in device dimensions and the therefrom following limitations in available surface area for the creation of the 1T-RAN capacitor create a serious obstacle to increasing the packaging density of DRAM devices. The problem of maintaining storage capacity while at the same time decreasing the 1T-RAM device dimensions remains a serious challenge in creating high-density 1T-RAM devices.

Using a two-dimensional stacked capacitor for the creation of a 64 MB DRAM cell, having a 1.5 $\mu m^2$ memory cell area, does not allow for the creation of the required capacitive storage capability. To address this problem, stacked capacitors have been proposed that make use of a three-dimensional structure in order to improve storage capacity. Variations of the stacked capacitor are for instance double stack, fin-structured, cylindrical, spread stacked and box structured capacitors.

In more recent applications, the planar capacitor has found increased use since the planar capacitor offers the advantage of being fully compatible in its creation with conventional logic device creation processes. The 1-T RAM cell size is however difficult to reduce when using the planar capacitor. A number of solutions have been suggested for this problem, the invention provides such a solution that allows for the use of a three-dimensional capacitor without requiring a large amount of surface area for the there-with created 1T-RAM cell.

U.S. Pat. No. 6,177,697 B1 (Cunningham) shows a capacitor and STI process.

U.S. Pat. No. 6,284,584 B1 (Hodges et al.) shows a process for a 1T memory.

U.S. Pat. No. 5,172,202 (Kazuo et al.) discusses a 1T memory stacked cell capacitor.

SUMMARY OF THE INVENTION

A principal objective of the invention is to create a 1T-RAM cell by means of simplified processing procedures.

Another objective of the invention is to create a 1T-RAM cell without thereby experiencing issues of surface planarity of the created 1T-RAM cell.

Yet another objective of the invention is to create a 1T-RAM cell comprising an enlarged capacitor by expanding a dielectric surface area within the cell and by using this expanded surface area for the creation of the 1T-RAM capacitor.

A still further objective of the invention is to provide a method of creating a 1T-RAM cell that allows for easy shrinkage of the cell size.

In accordance with the objectives of the invention a new method and structure is provided for the creation of a 1T-RAM cell. Masking layers for Shallow Trench Isolation (STI) regions are provided over a layer of pad oxide over a substrate, the STI trenches are etched in the substrate, filled with field isolation oxide which is planarized. A 3D capacitor area is defined over the substrate, a layer of polysilicon or HSG polysilicon is deposited over exposed surfaces of the defined 3D capacitor and over the STI etch mask. A protective layer of photoresist or BARC is deposited over the layer of polysilicon or HSG polysilicon aligned with the 3D-capacitor area. The exposited layer of polysilicon or HSG polysilicon is removed, creating the bottom plate of a capacitor. The STI mask is removed, including the layer of pad oxide, exposing the substrate. SAC oxide is grown over the exposed substrate, n/p well impurity implants are performed into the substrate. The SAC oxide is removed, gate oxide is grown to form a layer of dielectric for CMOS gate electrodes and the capacitor dielectric. A layer of polysilicon is deposited, patterned and etched defining gate electrodes and capacitor upper plates. Back-End-Of-Line processing is then performed to complete the gate electrodes and to provide conductive interconnects to the gate electrodes and the capacitors.

DESCRIPTION OF THE PREFERRED EMBODIMENTS

Figure 1:
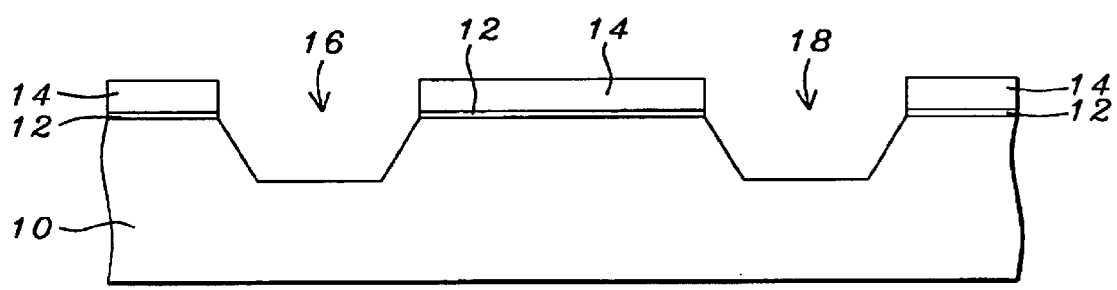
FIG. 1 shows a cross section of the surface of a semiconductor substrate over which first is created a layer of pad oxide over which second is created a layer if nitride. The layers of pad oxide and nitride are patterned, forming a Shallow Trench Isolation (STI) etch mask. STI trenches have been etched into the surface of the substrate.

The invention will now be described using FIGS. 1 through 11. Specifically referring to the cross section that is shown in FIG. 1, there is shown:

10, the surface of a silicon semiconductor substrate 12, a layer of pad oxide grown over the surface of substrate 10

14, a layer of silicon nitride created over the surface of the layer 12 of pad oxide 16 and 18, STI trenches etched into the surface of the substrate 10.

Substrate 10 is a conventional silicon monocrystalline semiconductor substrate, the growing of the layer 12 of pad oxide over the surface thereof can be a silicon dioxide material but may be a composite oxide, such as TEOS and silicon dioxide, or a nitride oxide layer or a like gate dielectric. The pad oxide 12 can be silicon dioxide, thermally grown in an oxygen-steam ambient at a temperature between 800 and 1,000 degrees C. to a thickness of about 30 to 300 Angstrom. Alternatively, other methods of oxidation can be used for the creation of layer 12 of pad oxide, such as oxidation in a dry oxygen and anhydrous hydrogen chloride in an atmospheric or low pressure environment, or in a low temperature, high pressure environment and the like.

The layer 14 of silicon nitride ($Si_3N_4$) can be deposited using LPCVD or PECVD procedures at a pressure between about 300 mTorr and 400 mTorr, at a temperature between about 600 and 800 degrees C., to a thickness of about 2,500 Angstrom using $NH_3$ and $SiH_4$. The silicon nitride layer 14 can also be deposited using LPCVD or PECVD procedures using a reactant gas mixture such as dichlorosilane ($SiCl_2H_2$) and ammonia ($NH_3$).

STI trenches 16 and 18 are created using a conventional process of STI formation.

One conventional approach in forming STI regions in the surface of a substrate is to deposit silicon nitride (layer 14) on thermally grown oxide (layer 12). After deposition of the nitride, a shallow trench is etched into the substrate using a mask. A layer of STI oxide is then conventionally deposited into the trench so that the trench forms an area of insulation dielectric, which acts to isolate the devices in a chip and thus reduce the cross talk between active devices. The excess deposited oxide is conventionally polished off and the trench planarized to prepare for the next level of metallization. The silicon nitride is provided to the silicon to prevent polishing of the masked silicon oxide of the device.

The process of creating the STI openings is typically performed mainly by plasma etching. Basically, in plasma etching as used in the manufacturing of silicon integrated devices a silicon wafer, on whose surface have been deposited various layers, is positioned on a first electrode in a processing chamber that also includes a second electrode spaced opposite the first. As a gaseous medium that consists of one or more gasses is flowed through the chamber, an r-f voltage, which may include components of different frequencies, is applied between the two electrodes of the processing chamber to create a discharge that ionizes the gaseous medium and that forms a plasma that etches the wafer. By appropriate choice of the gasses of the gaseous medium and of the parameters of the discharge, selective and anisotropic etching is achieved. In most modern processes, a dry etch is performed wherein the wafer is exposed to a plasma, formed in the flow of one or more gasses. Typically, one or more halogenated compounds are used as an etchant gas. For example, $CF_4$, $CHF_3$ (Freon 23) $SF_6$ or $NF_3$ can be used. Added can be gases such as $O_2$, Ar and $N_2$.

Figure 3:
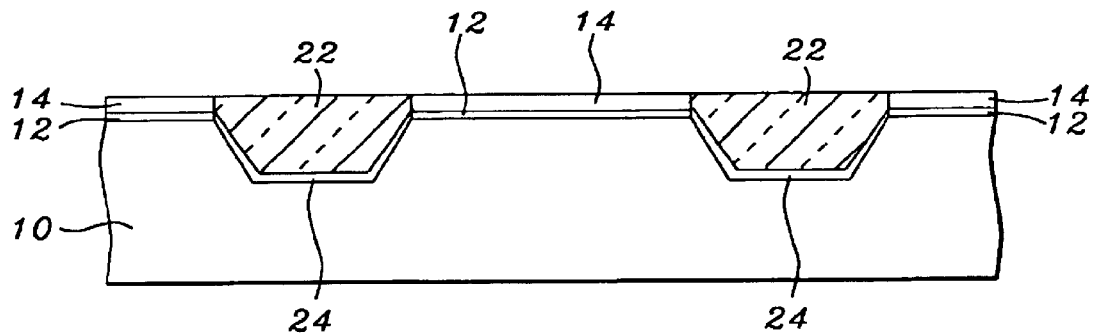
FIG. 3 shows a cross section after the deposited layer of STI oxide has been planarized down to the surface of the layer of etch stop material, the layer of etch stop material has been used as stop for the planarization, reducing the height of the layer of etch stop by an amount.

The cross section of FIG. 3 shows the creation of lining oxide 24 after which layer 22 of STI oxide is deposited.

Conventional methods of oxidation may be applied for the creation of the lining oxide 24. For instance, the wafer may be placed in an oxidation environment, generally in steam at a high temperature such as 1,100 degrees C. The portions of the wafer not covered by the oxidation barrier oxidize to form thermal silicon thereat, oxidation of the silicon surface is masked by the oxidation barrier.

Layer 22 of STI oxide can be created with a chemical vapor deposition (CVD) of silicon dioxide ($SiO_2$), filling the trenches 16 and 18, with the STI oxide further overlying layer 14 of silicon nitride. Layer 22 of silicon dioxide can be deposited by PECVD, PECVD is preferred because of the low deposition temperature. PECVD silicon dioxide may be deposited at temperatures between 200 and 350 degrees C. for $SiH_4/O_2$ or $SiH_4/N_2O$ precursors. The silicon oxide layer is deposited to a thickness of about 3,000 Angstrom.

The layer 22 of STI oxide is then planarized, as shown in the cross section of FIG. 3, using for instance methods of Chemical Mechanical Polishing (CMP) for this purpose. An etchback can also be applied for this purpose, layer 22 of silicon oxide can be etched by RIE or anisotropic plasma etching by using an etchant containing fluorocarbons, for example $CF_4$ or $CHF_3$. Layers 22 of STI oxide remain in place inside the trenches 16 and 18 and overlying layers 24 of liner oxide after the planarization or etch of layer 22.

Figure 2:
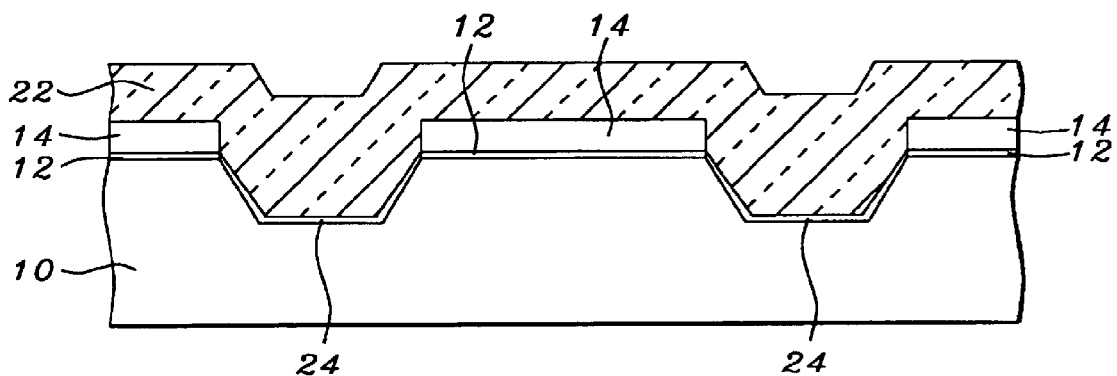
FIG. 2 shows a cross section after providing lining oxide, over the exposed surfaces of the STI trenches, in addition STI oxide has been deposited.

The removal of layer 22 of STI oxide from the surface of layer 14 of silicon nitride has resulted in reducing the height of the latter layer 14 by an amount, as is apparent when comparing the height of layer 14 shown in the cross sections of FIGS. 2 and 3.

Figure 4:
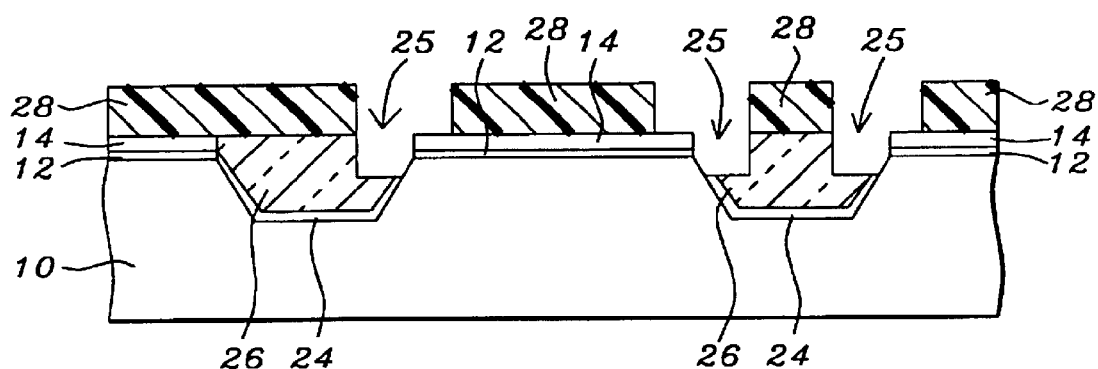
FIG. 4 shows a cross section after crown patterning and etching, the etch stopping at the STI mask and on the sidewalls of the STI trench. Capacitor areas are defined in this manner.

A photoresist mask 28, FIG. 4, is next created over the surface of substrate 10. The openings 25 provided in the layer 28 of photoresist define capacitor areas over the surface of substrate 10. Photoresist mask 28, FIG. 4, can be created, using conventional methods of photoresist coating followed by exposure and development of the coated layer of photoresist. It must be noted in the cross section that is shown in FIG. 4 that the etch of the layers 26 of STI oxide stops on the surface of layer 14, FIG. 4, protecting the corners of the STI trenches, further removing the liner oxide 24 from the sidewalls of the STI trenches in accordance with the photoresist mask 28.

During this crown etch the layer 14 of nitride protects the surface of the substrate 10 from any damage or rounding of the corners of the STI trenches 16 and 18 around the upper perimeter of these trenches.

Figure 5:
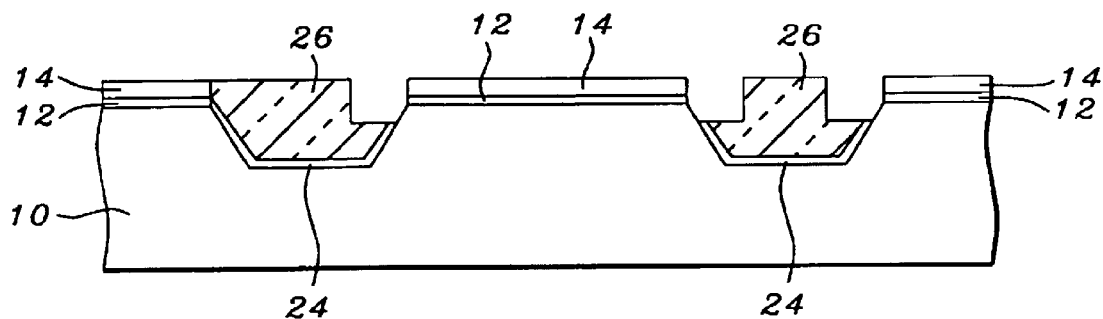
FIG. 5 shows a cross section after the photoresist mask has been removed.

FIG. 5 shows a cross section after the photoresist mask 28 has been removed from the surface of substrate 10 using conventional methods of oxide ashing followed by a thorough surface clean.

Figure 6:
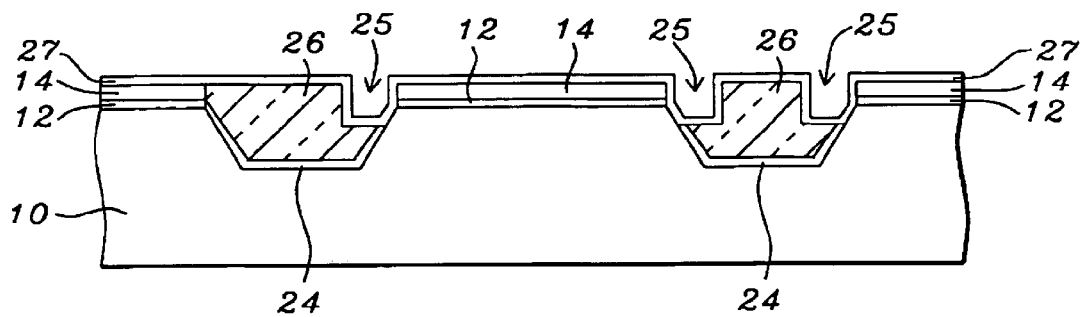
FIG. 6 shows a cross section after a thin layer of polysilicon or Hemispherical Grain (HSG) polysilicon has been deposited, the thin later of polysilicon or Hemispherical Grain polysilicon forms the bottom electrode of capacitors of the 1T-RAM cells.

FIG. 6 shows, of critical importance to the invention, a cross section after the deposition of a layer 27 of polysilicon or Hemispherical Grain (HSG) polysilicon, this layer 27 will form the bottom electrode of thereover created capacitors of the 1T-RAM cells.

The layer 27 of polysilicon or Hemispherical Grain (HSG) polysilicon can be deposited using LPCVD procedures, at a temperature between about 600 and 800 degrees C., to a thickness between about 500 to 5,000 Angstrom.

For the deposition of layer 27 of HSG it must be realized that at temperatures below about 550 degrees C. the 'as deposited' film has an amorphous structure. At temperatures between about 550 degrees C. and 580 degrees C. there is a transition between amorphous silicon and polycrystalline silicon. Hemispherical grain (HSG) polysilicon is typically grown in this transitional range. At temperatures above about 580 degrees C. the 'as deposited' film has a polycrystalline structure.

It must be noted in the cross section shown in FIG. 6 that the deposited layer 27 of polysilicon or HSG covers inside surfaces of the openings 25 etched into the STI oxide layers 26 in accordance with the crown etch blocking mask 28, FIG. 4. These layers are therefore located such that they can serve as bottom plates for thereover created capacitors.

Figure 7:
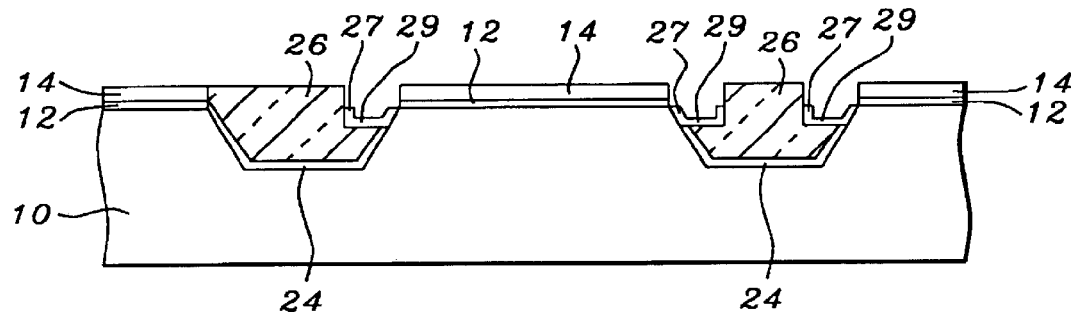
FIG. 7 shows a cross section after a layer of photoresist or BARC has been spin coated over the surface of the structure of FIG. 6, filling the capacitor openings. The thin layer of polysilicon or HSG has been removed from the STI mask by etchback or Chemical Mechanical Polishing (CMP).

As a next step, FIG. 7, a layer 29 of photoresist or organic BARC is spin-coated over the surface of the structure shown in cross section in FIG. 6, filling openings 25 to about the level of the surface of substrate 10. These layers 29 of photoresist or BARC protect the layer 27 during the removal of this layer from the surface of the STI mask 14, further assuring that the layer 27 remains in place in a controlled manner for the formation of bottom plates of thereover created capacitors. This is more clearly realized in observing that the final layers 27 of SiN do not protrude above the plane of the surface of substrate 10, as can be seen in the cross section of FIG. 7.

The invention continues, FIG. 7, with the removal of the deposited layer 27 of polysilicon or HSG from the STI blocking mask 14, using methods of either CMP or etchback. As part of this removal, the layer 27 is removed from sidewalls of the STI oxide 26 and the STI trench blocking mask 14 where these layers are not protected by the layers 29 of photoresist or BARC, as shown in the cross section of FIG. 7.

Figure 8:
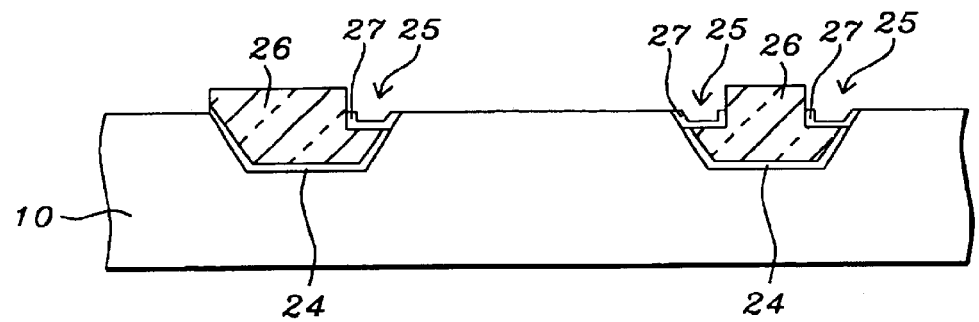
FIG. 8 shows a cross section after the STI mask and the layer of pad oxide have been removed from the substrate, exposing the substrate, the spin-coated photoresist of BARC has also been removed.

FIG. 8 shows a cross section after the STI blocking mask 14 and the underlying layer 12 of pad oxide have been removed, exposing the substrate 10. As part of this process, layers 29 of photoresist or organic BARC are also removed from openings 25, as shown in the cross section of FIG. 8.

Figure 9:
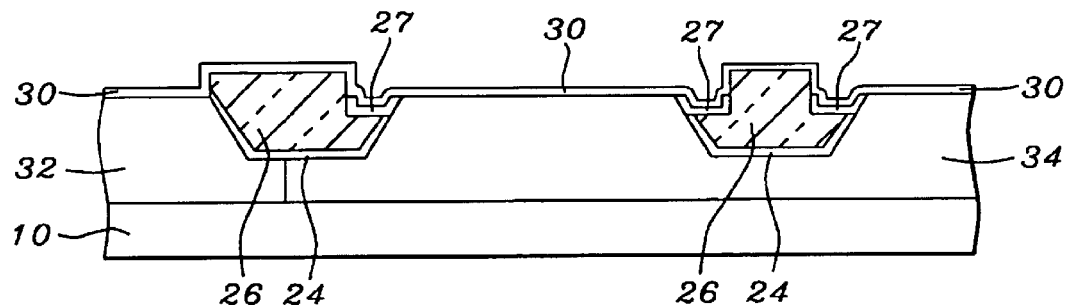
FIG. 9 shows a cross section after a layer of SAC oxide has been created (for protection of the substrate surface during subsequent impurity implants), n-well and p-well implants have been performed into the surface of the substrate.

Next, FIG. 9, a layer 30 of sacrificial oxide is grown over the exposed surfaces, this layer 30 of SAC oxide is provided to protect the surface of substrate 10 during subsequent impurity implants into the surface thereof.

The layer 30 of sacrificial oxide can be created using the following processing conditions: source: wet $O_2$, flow rate for the $O_2$ is about 0 to 10 sccm, flow rate for the $H_2$ is about 15 slpm, temperature of about 875 degrees C., under atmospheric pressure, time of about 30 minutes, a furnace is used due to the thermal oxide.

The layer 30 of sacrificial oxide can also be grown over the surface of the substrate 10 using LPCVD, PECVD, or APCVD processing, in a steam oxygen ambient, at a temperature between about 400 to 800 degrees C.

Well implants 32 and 34, of either p-type of n-type impurity implants, are next performed into the surface of substrate 10.

The type of impurity that is used for the impurity implants 32/34 is determined by the type of well that is created in the surface of substrate 10 over which a capacitor and a 1T-RAM cell is created.

A typical n-well implantation can be performed using arsenic or phosphorous with an energy within the range of between 300 to 600 KeV and a dose within the range of between 1E13 to 5E14 atoms/$cm^3$, p-well ion implantations is preferred to use indium or boron with an energy within the range of between 50 to 400 KeV and a dose within the range of between 1E12 to 5E13 atoms/$cm^3$.

Figure 10:
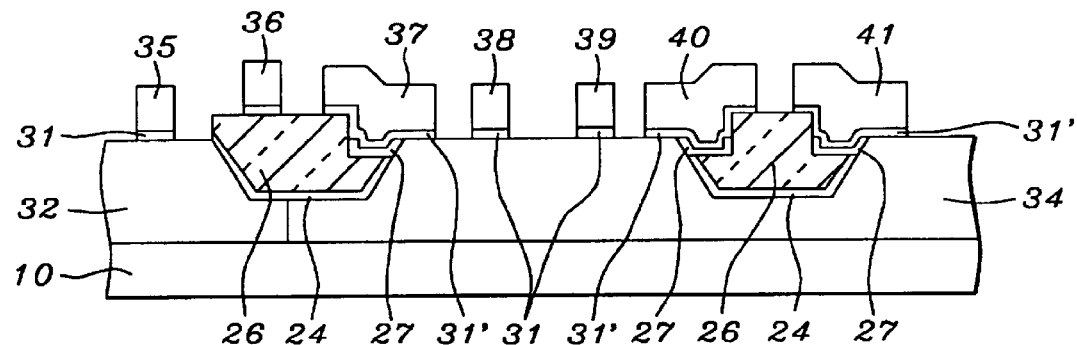
FIG. 10 shows a cross section after the layer of SAC oxide has been removed, gate oxide has been grown, a layer of polysilicon has been deposited, patterned and etched, creating layers of gate electrode material and layers of a top plate for the to be created capacitors.
Figure 11:
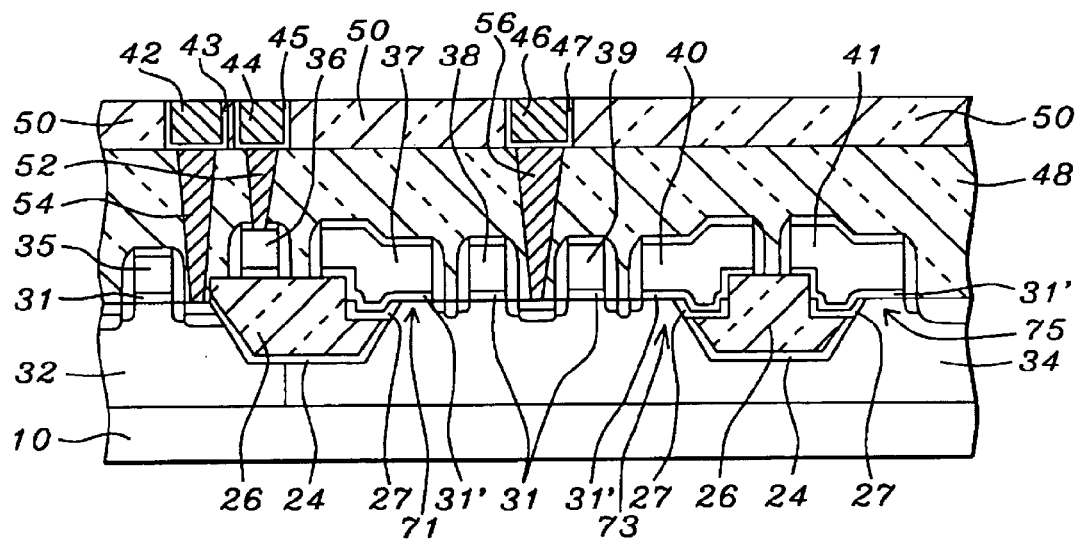
FIG. 11 shows a cross section after processing has been performed for the completion of the 1-T RAM cell.

The remaining processing steps, as shown in FIGS. 10 and 11, complete the formation of the capacitors and gate electrode structures.

For this purpose, a layer of gate material, preferably comprising polysilicon, is deposited over the surface shown in cross section in FIG. 9. This layer of gate material is patterned and etched, resulting in the cross section that is shown in FIG. 10, wherein specifically are highlighted:

layers 31 of gate oxide for the thereover to be created gate electrodes; where the layer of gate oxide serves as a dielectric layer of the to be created capacitors these layers have been highlighted as layer 31' for purposes of differentiation over the n/p-well 32, a layer 35 of gate material has been created over the left-most STI region 26 a layer 36 of gate material has been created, serving as the basis for a word-line 37, 40 and 41 are patterned and etched layer of gate material, preferably comprising polysilicon, for capacitor top plate for three capacitors created over the surface of substrate 10; layers 31' form the capacitor dielectric layers 27, bottom plates of the capacitors 38 and 39, layers of gate material overlying the layers 31 of gate oxide, these two gate structures will serve as bit-line support gates.

The 1T-RAM is then completed as shown in the cross section of FIG. 11, wherein are highlighted:

48, a first layer of dielectric 50, a second layer of dielectric 52, a conductive interconnect to gate electrode 36

54, a conductive interconnect to the drain region of gate electrode 35

56, a conductive interconnect to the drain region of gate structures 38 and 39

42, 44 and 47, conductive interconnects to the underlying conductive interconnects 54, 52 and 56

43, 45, 47, barrier and or seed layers for conductive interconnects 42, 44 and 47

71, 73 and 75, three capacitors created by the invention; of these capacitors, the substrate 10 serves as the first plate of the capacitors, the layers 31' of gate oxide form the capacitor dielectric while the salicided layers 37, 40 and 41 form the second plate of the capacitors.

Not highlighted in the cross section of FIG. 11 are gate electrode elements which are shown such as source/drain region impurity implants and gate spacers formed over sidewalls of created gate structures and, notably, over sidewalls of the created capacitors 71, 73 and 75. In addition, salicidation has been provided to the contact surfaces of the active elements that are shown in the cross section of FIG. 9, these layers of salicided material are shown but, in order to avoid making the cross section of FIG. 9 too crowded with references, not highlighted. As salicided surfaces are shown layers overlying structures 35, 36, 38, 39, the source/rain regions of gate electrode 35, the drain region of the gate electrode pair 38/39 and the three capacitors 71, 73 and 75.

From the cross section that is shown in FIG. 11, it is clear that contact point 44 serves as a word-line (or top plate) contact of the created RAM cell while contact point 46 serves as the bit-line for the created DRAM cell. It is now also more clear that implant 34 creates a cell-well while implant 32 creates a n/p-well.

The steps of the invention can be summarized as follows:

Provide a substrate

Provide pad oxide and a STI mask over the substrate

Etch STI trenches into the substrate in accordance with the STI mask

Fill the STI trenches with field isolation oxide to the level of the surface of the STI mask Provide a crown etch mask over the substrate, defining capacitor areas over the substrate Etch the STI oxide in accordance with the crown etch mask Remove the crown etch mask Deposit a layer of polysilicon or HSG polysilicon to form the bottom plates of capacitors Coat PR of organic BARC over the substrate, filling the capacitor openings Remove the polysilicon or HSG polysilicon from the STI mask Remove the STI mask and the underlying pad oxide, at the same time removing the coating of PR or BARC from the capacitor openings, leaving a layer of polysilicon or HSG polysilicon overlying inside surfaces of the capacitor openings to serves as capacitor bottom plates Grow a layer of SAC oxide, perform n/p well impurity implantations into the substrate Remove the SAC oxide Create gate oxide which serves as gate oxide for created gate electrodes and as dielectric for created capacitors Deposit, pattern and etch a layer of gate material, creating gate electrodes and upper plates for capacitors Further complete the gate electrodes by performing LDD impurity implants self-aligned with the gate electrode structures, by creating gate spacers, by performing source/drain impurity implantations self-aligned with the gate structures, and Providing conductive interconnects to the created gate electrodes and the created capacitors.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a 1T RAM cell, comprising:

providing a substrate, the substrate having been provided with at least one trench filled with isolation material having a first surface area surrounded by a trench etch blocking mask comprising a layer of pad oxide over the substrate and a layer of etch stop material over the pad oxide to a height of the first surface area;

removing the isolation material from the at least one trench to a depth over a second surface area being smaller than the first surface area and being adjacent to a perimeter of the at least one opening created through the trench etch blocking mask, creating at least one third surface area of the layer of isolation material exposed by the removal of the layer of isolation material and being larger than the second surface area;

forming at least one capacitor over the at least one third surface area by:

(i) forming at least one layer of lower capacitor plate material over the at least one third surface area, said forming at least one layer of lower capacitor plate material comprising:

(1) depositing a layer of lower capacitor plate material over the trench etch blocking mask, including the layer of isolation material and the at least one third surface area;

(2) creating a protective layer over the layer of lower capacitor plate material aligned with the third surface area;

(3) removing the layer of lower capacitor plate material from the trench etch blocking mask and the at least one layer of isolation material; and (4) removing the trench etch blocking mask and the protective layer, exposing the at least layer of lower capacitor plate material;

(ii) forming at least one layer of capacitor dielectric material over the at least one layer of lower capacitor material; and (iii) forming at least one layer of upper capacitor plate material over the at least one layer of capacitor dielectric material.

2. The method of claim 1, the isolation material comprising Shallow Trench Isolation oxide.

3. The method of claim 1, the etch stop material comprising silicon nitride.

4. The method of claim 1, the layer of lower capacitor plate material comprising a material selected from the group consisting of polysilicon and Hemispherical Grain (HSG) polysilicon.

5. The method of claim 1, the capacitor dielectric material comprising gate oxide.

6. The method of claim 1, the upper capacitor plate material comprising polysilicon.

7. The method of claim 1, further saliciding the layer of upper capacitor plate material.

8. A method for the creation of a 1T RAM cell, comprising:

providing a substrate, the substrate having been provided with a trench etch blocking mask having at least one opening there-through, the trench etch blocking mask comprising a layer of pad oxide over the substrate and a layer of etch stop material over the layer of pad oxide;

etching at least one trench having a first surface area into the substrate in accordance with the trench etch blocking mask;

creating a layer of oxide liner over inside surfaces of the at least one trench;

filling the at least one trench with a layer of isolation material to a level of etch stop material, creating at least one layer of isolation material;

removing the at least one layer of isolation material from the at least one trench to a depth over a second surface area being smaller than the first surface area and being adjacent to a perimeter of the at least one opening created through the trench etch blocking mask, creating at least one third surface area of the at least one layer of isolation material exposed by the removal of the layer of isolation material and being larger than the second surface area, removing oxide liner material from a sidewall of the at least one trench;

depositing a layer of lower capacitor plate material over the trench etch blocking mask, including the layer of isolation material and the at least one third surface area of the at least one layer of isolation material;

creating a protective layer over the layer of lower capacitor plate material aligned with the third surface area of the at least one layer of isolation material;

removing the layer of lower capacitor plate material from the trench etch blocking mask and the at least one layer of isolation material to a height about equal to the trench etch blocking mask;

removing the trench etch blocking mask and the protective layer, exposing at least one lower capacitor plate;

creating a capacitor dielectric over the at least one lower capacitor plate; and creating an upper capacitor plate over the at least one capacitor dielectric.

9. The method of claim 8, further saliciding the layer of upper capacitor material.

10. The method of claim 8, the layer of etch stop material comprising silicon nitride.

11. The method of claim 8 wherein the isolation material comprises Shallow Trench Isolation oxide.

12. The method of claim 8 wherein the lower capacitor plate comprises a material selected from the group consisting of polysilicon and Hemispherical Grain (HSG) polysilicon.

13. The method of claim 8 wherein of upper capacitor plate comprises polysilicon.

14. The method of claim 8 wherein the protective layer comprises a material selected from the group consisting of photoresist and BARC.

15. A method for the creation of a 1T RAM cell, comprising the steps of:

providing a substrate;

growing a layer of pad oxide over the substrate;

depositing a layer of etch stop material over the layer of pad oxide;

etching at least one trench having a first surface area through the layer of etch stop material, through the layer of pad oxide and into the substrate;

growing a layer of liner oxide over exposed surfaces of the at least one trench;

depositing a layer of isolation material over the layer of etch stop material, including the layer of liner oxide, filling the at least one trench;

planarizing the layer of isolation material to about the layer of etch stop material, creating at least one layer of isolation material having a first surface area;

providing a crown etch mask over the layer of etch stop material, including the at least one layer of isolation material, exposing the at least one layer of isolation material over a second surface area being smaller than the first surface area along a perimeter of said at least one layer of isolation material, exposing the etch stop material adjacent to a perimeter of the at least one trench;

etching the at least one layer of isolation material in accordance with the crown etch mask, creating a third surface area of the at least one layer of isolation material being larger than the second surface area, removing liner oxide from a sidewall of the at least one trench;

removing the crown etch mask;

depositing a layer of lower capacitor plate material over the at least one layer of isolation material thereby including the third surface area of the at least one layer of isolation material and over the layer of etch stop material;

depositing a layer of protective material over the layer of lower capacitor plate material aligned with the third surface of the at least one layer of isolation material to a height about equal to the etch stop material;

removing exposed lower capacitor plate material;

removing the layer of etch stop material, the layer of pad oxide and the layer of protective material, exposing at least one lower capacitor plate;

creating at least one layer of capacitor dielectric material over the at least one lower capacitor plate; and creating at least one layer of upper capacitor plate material over the at least one capacitor dielectric material.

16. The method of claim 15, further saliciding the layer of upper capacitor material.

17. The method of claim 15 wherein the layer of etch stop material comprises silicon nitride.

18. The method of claim 15 wherein the isolation material comprises Shallow Trench Isolation oxide.

19. The method of claim 15 wherein the protective material comprises a material selected from the group consisting of photoresist and BARC.

20. The method of claim 15 wherein the at least one lower capacitor plate material comprises a material selected from the group consisting of polysilicon and Hemispherical Grain (HSG) polysilicon.

21. The method of claim 15 wherein the at least one layer of capacitor dielectric comprises gate oxide.

22. The method of claim 15 wherein the at least one layer of upper capacitor plate material comprises polysilicon.

23. A method for the creation of a 1T RAM cell, comprising the steps of:

providing a substrate, the substrate having been provided with a trench etch blocking mask having at least one opening there-through, the trench etch blocking mask comprising a layer of pad oxide over the substrate and a layer of etch stop material over the layer of pad oxide;

etching at least one trench having a first surface area into the substrate in accordance with the trench etch blocking mask;

growing a layer of liner oxide over exposed surfaces of the at least one trench;

depositing a layer of isolation material over the layer of etch stop material, including the layer of liner oxide, filling the at least one trench;

planarizing the layer of isolation material to about the layer of etch stop material, creating at least one layer of isolation material having a first surface area;

providing a crown etch mask over the layer of etch stop material, including the at least one layer of isolation material, exposing the at least one layer of isolation material over a second surface area being smaller than the first surface area along a perimeter of said at least one layer of isolation material, exposing the etch stop material adjacent to a perimeter of the at least one trench;

etching the at least one layer of isolation material in accordance with the crown etch mask, creating a third surface area of the at least one layer of isolation material being larger than the second surface area, removing liner oxide from a sidewall of the at least one trench;

removing the crown etch mask;

depositing a layer of lower capacitor plate material over the at least one layer of isolation material including the third surface area of the at least one layer of isolation material and over the layer of etch stop material;

depositing a layer of protective material over the layer of lower capacitor plate material aligned with the third surface of the at least one layer of isolation material to a height about equal to the etch stop material;

removing exposed lower capacitor plate material, creating at least one lower capacitor plate;

removing the layer of etch stop material, the layer of pad oxide and the layer of protective material, exposing the at least one lower capacitor plate, first exposing the substrate;

growing a layer of SAC oxide over the first exposed substrate, including the at least one lower capacitor plate;

performing p/n-type impurity well implants into the substrate;

removing the layer SAC oxide, second exposing the substrate;

growing a layer of gate oxide over the second exposed surface of the substrate, including the at least one lower capacitor plate;

deposing a layer of gate material over the gate oxide;

patterning and etching the layers of gate material and gate oxide, concurrently creating gate structures overlying gate oxide, at least one upper capacitor plate and at least one layer of capacitor dielectric; and performing processing for completion of gate electrodes and conductive interconnects thereto and to the upper capacitor plates.

24. The method of claim 23 wherein the performing processing for completion of gate electrodes and conductive interconnects thereto and to the upper capacitor plates comprises steps of salicidation of points of contact to the gate electrodes and the upper capacitor plates.

25. The method of claim 23, further saliciding the layer of upper capacitor material.

26. The method of claim 23 wherein the layer of etch stop material comprises silicon nitride.

27. The method of claim 23 wherein the isolation material comprises Shallow Trench Isolation oxide.

28. The method of claim 23 wherein the protective material comprises a material selected from the group consisting of photoresist and BARC.

29. The method of claim 23 wherein the at least one lower capacitor plate material comprises a material selected from the group consisting of polysilicon and Hemispherical Grain (HSG) polysilicon.

30. The method of claim 23 wherein the at least one layer of capacitor dielectric comprises gate oxide.

31. The method of claim 23 wherein the at least one layer of upper capacitor plate material comprises polysilicon.

32. A method for the creation of a damage-free surface of a capacitor in combination with creating a 1T-RAM cell, comprising:

providing a substrate;

creating at least one trench in the substrate, the trench being surrounded by a layer of pad oxide over the substrate and a layer of etch stop material over the pad oxide;

growing liner oxide over surfaces of the at least one trench;

filling the at least one trench with isolation material having a first surface area to a level about equal to the layer of etch stop material;

defining capacitor areas by applying a crown etch of the isolation material using a crown etch mask, stopping on a sidewall of the at least one trench, removing isolation material and liner oxide from around a perimeter of the at least one trench to a depth, exposing a second surface area of the isolation material;

creating a layer of capacitor lower plate material over the second surface area of the isolation material; and performing additional processing for completion of capacitors in combination with creating a 1T-RAM cell.

33. The method of claim 32, the creating a layer of capacitor lower plate material over the second surface area of the isolation material comprising:

removing the crown etch mask;

depositing a layer of capacitor dielectric material over the etch stop material, including the second surface area of the isolation material;

deposing a layer of protective material over the capacitor dielectric material, overlying the second surface area of the isolation material to a height about equal to the etch stop material;

removing the layer of capacitor dielectric material from the etch stop material; and removing the layer of protective material.

34. The method of claim 33, the layer of capacitor dielectric material comprising gate oxide.

35. The method of claim 33, the protective material being selected from the group consisting of photoresist and BARC.

36. The method of claim 32, the isolation material comprising Shallow Trench Isolation oxide.

37. The method of claim 32, the filling the at least one trench with isolation material comprising planarizing the layer of isolation material.

38. The method of claim 37, the planarizing comprising methods of Chemical Mechanical Polishing.

39. The method of claim 32, the performing additional processing comprising:

removing the layer of etch stop material and the layer of pad oxide, first exposing the substrate;

growing a layer of SAC oxide over the first exposed surface of the substrate;

performing p/n-type impurity well implants into the substrate;

removing the layer SAC oxide, second exposing the substrate;

growing a layer of gate oxide over the second exposed surface of the substrate;

deposing a layer of upper gate material over the gate oxide;

patterning and etching the layers of upper gate material and gate oxide, concurrently creating upper capacitor plates and layers of capacitor dielectric; and performing processing for completion of gate electrodes and conductive conducts thereto and to the upper capacitor plates.

40. The method of claim 39 wherein the performing processing for completion of gate electrodes and conductive interconnects thereto and to the upper capacitor plates comprises steps of salicidation of points of contact to the gate electrodes and the upper capacitor plates.

41. The method of claim 32 wherein the layer of etch stop material comprises silicon nitride.

42. The method of claim 32 wherein the isolation material comprises Shallow Trench Isolation oxide.

43. The method of claim 40 wherein the layer of upper gate material comprises polysilicon.

44. The method of claim 32 wherein the layer of lower gate material comprises a material selected from the group consisting of polysilicon and Hemispherical Grain (HSG) polysilicon.

* * * * *